United States Patent [19]
Bertin et al.

[11] Patent Number: 5,818,748
[45] Date of Patent: Oct. 6, 1998

[54] CHIP FUNCTION SEPARATION ONTO SEPARATE STACKED CHIPS

[75] Inventors: Claude Louis Bertin, South Burlington; John Edward Cronin, Milton, both of Vt.

[73] Assignee: International Business Machines Corporation, Armonk, N.Y.

[21] Appl. No.: 560,222

[22] Filed: Nov. 21, 1995

[51] Int. Cl.[6] ........................................ G11C 5/02
[52] U.S. Cl. ........................ 365/51; 365/63; 365/72; 257/686; 257/777
[58] Field of Search .................. 365/51, 63, 72; 257/686, 777; 361/790, 735

[56] References Cited

U.S. PATENT DOCUMENTS

| | | | |
|---|---|---|---|
| 4,266,282 | 5/1981 | Henle et al. | 365/52 |
| 4,426,689 | 1/1984 | Henle et al. | 365/52 |
| 4,467,342 | 8/1984 | Tower | 357/30 |
| 4,500,905 | 2/1985 | Shibata | 357/68 |
| 4,612,083 | 9/1986 | Yasumoto et al. | 156/633 |
| 4,706,166 | 11/1987 | Go | 361/403 |
| 4,754,316 | 6/1988 | Reid | 357/68 |
| 4,761,681 | 8/1988 | Reid | 357/68 |
| 4,801,992 | 1/1989 | Golubie | 357/40 |
| 4,887,338 | 12/1989 | Handler | 24/306 |
| 4,887,339 | 12/1989 | Bellanger | 24/575 |
| 4,894,706 | 1/1990 | Sato et al. | |
| 4,897,708 | 1/1990 | Clements | |
| 4,939,568 | 7/1990 | Kato et al. | 357/75 |
| 4,950,173 | 8/1990 | Minemura et al. | 439/82 |
| 4,999,331 | 3/1991 | Dzarnoski, Jr. et al. | 437/51 |
| 5,006,073 | 4/1991 | Mennona, Jr. | 439/77 |
| 5,025,306 | 6/1991 | Johnson et al. | 357/75 |
| 5,089,880 | 2/1992 | Meyer et al. | 357/75 |
| 5,110,298 | 5/1992 | Dorinski et al. | 439/65 |
| 5,116,462 | 5/1992 | Bartha et al. | 156/643 |
| 5,130,276 | 7/1992 | Adams et al. | 437/225 |
| 5,196,722 | 3/1993 | Bergendahl et al. | 257/304 |
| 5,202,754 | 4/1993 | Bertin et al. | 257/684 |
| 5,455,445 | 10/1995 | Kurtz et al. | 257/777 |
| 5,477,083 | 12/1995 | Buckley, III et al. | 257/679 |
| 5,536,973 | 7/1996 | Yamaji | 257/777 |

OTHER PUBLICATIONS

Spector, C. J. & Stoller, H. I., "Chip–on–Chip Module for Assembly," IBM Technical Disclosure Bulletin, vol. 25, No. 10 (Mar. 1983).

Rossi, F. & Straehle, W., "Mated Array Chip Configuration," IBM Technical Disclosure Bulletin, vol. 28, No. 2 (Jun. 1985).

McConnell et al., "An Experimental 4 Mb Flash EEPROM with Sector Erase", IEEE Journal of Solid State Circuits, vol. 26, No. 4, Apr. 1991, pp. 484–491.

Kuriyama et al., "A 5V Only 0.6μm Flash EEPROM with Row Decoder Scheme in Triple–Well Structure", IEEE International Solid State Circuits Conference, 1992, pp. 152–153.

Little, M.J. et al, "The 3–D Computer" (Hughes Research Lab), J. VLSI Sig. Proc. 2, 79 (1990), one page.

"An 85ns 16Mb CMOS EEPROM with Alterable Word Organization", IEEE International Solid–State Circuits Conference, 1990, pp. 56–57.

Münchmeyer, D. and Langen, J., "Manufacture of three–dimensional microdevices using synchrotron radiation (invited)", Rev. Sci. Instrum., 63 (1), Jan. 1992, pp. 713–721.

(List continued on next page.)

Primary Examiner—David C. Nelms
Assistant Examiner—F. Niranjan
Attorney, Agent, or Firm—Heslin & Rothenberg, P.C.; Wayne F. Reinke, Esq.

[57] ABSTRACT

The high-voltage drivers and decoders of a direct-write EEPROM memory array are separated from the word lines and placed onto separate stacked chips. The separate chips are stacked face-to-face, and force-responsive self-interlocking microconnectors are used to physically and electrically connect the separate chips.

49 Claims, 14 Drawing Sheets

OTHER PUBLICATIONS

Reed et al., "Silicon Micro–Velcro", Advanced Materials, 4, No. 1, 1992, pp. 48–52.

Han et al, "Micromechanical Velcro", Journal of Microelectromechanical Systems, vol. 1, No. 1, Mar. 1992, 7 pages.

Anacker et al., "Fabrication of Multiprobe Miniature Electrical Connector", IBM Technical Disclosure Bulletin, vol., 19, No. 1, Jun. 1976, 1 page.

Henle, R.A., "Vertical Chip Packaging", IBM Technical Disclosure Bulletin, vol. 20, No. 11A, Apr. 1978, p. 4339.

RAM PACK 32, Irvine Sensors Corporation, Costa Mesa, CA, brochure, 1 page.

Chang, H., Bubble–Domain Three–Dimensional Magneto–Optic Memory, IBM Technical Disclosure Bulletin, vol. 14, No. 9, Feb. 1972, p. 2561.

Johnson, A.H., "Edge–Connected Chip Carrier", IBM Technical Disclosure Bulletin, vol. 21, No. 7, Dec. 1978, p. 2763.

Suer, M., "Pursuing 3–D Packages", Electronic Engineering Times, Jan. 21, 1991, p. 66.

Lineback, J.R., "3–D IC Packaging Moves Closer To Commercial Use", article from Dallas, Texas, 1 page.

Val et al., "3–D Interconnection for Ultra–Dense Multichip Packages", IEEE Trans CHMFT, 13, 814, 1990, p. 81.

Higuchi et al., "An 85ns 16Mb COMS EPROM with Alterable Word Organization", IEEE International Sold–State Circuits Conference, 1990, pp. 56–57.

King L. Tai, et al., "A CHIP–ON–CHIP DSP/SRAM MULTICHIP MODULE", AT&T Bell Laboratories, International Conference on Multichip Modules, Apr. 1995, pp. 466–471.

Shin–ichi Sekine, et al., "A 'GaAs on Si' PLL Frequency Synthesizer IC using Chip on Chip Technology" IEEE 1994 Custom Integrated Circuits Conference, May 1994, pp. 563–565.

D.J. Bodendorf, et. al., "ACTIVE SILICON CHIP CARRIER",IBM Technical Disclosure bulletin, vol. 15, No. 2, Jul. 1972, pp. 656–657.

"PARTITIONING FUNCTION AND PACKAGING OF INTEGRATED CIRCUITS FOR PHYSICAL SECURITY OF DATA", IBM Disclosure Bulletin, vol. 32, No. 1, Jun. 1989, pp. 46–49.

5,818,748

CHIP FUNCTION SEPARATION ONTO SEPARATE STACKED CHIPS

CROSS-REFERENCE TO RELATED APPLICATION

This application contains subject matter which is related to the subject matter of the following applications which are assigned to the same assignee as this application, all of which are being filed concurrently herewith:

"Three-Dimensional Programmable Logic Array", by C. Bertin et al., Ser. No. 08/560,250 (Docket No. BU9-94-109), filed Nov. 11, 1995; and "Microconnectors," by C. Bertin et al., Ser. No. 08/560,257 (Docket No. BU9-94-110), filed Nov. 21, 1995.

BACKGROUND OF THE INVENTION

1. Technical Field

The present invention generally relates to three-dimensional semiconductor chips. More particularly, the present invention relates to the separation of semiconductor chip functions onto separate stacked chips.

2. Background

Recent density improvements in semiconductor chips have strained the ability of the designers to match subcircuitries, due to differences in size resulting from the density improvements. For example, the ability to match the drive circuitry to the memory array in memory array circuits has been strained, since some memory arrays now require a relatively high voltage. Such is the case with EEPROM (electrically erasable programmable read only memory) memory arrays. More specifically, as the pitch of word lines continues to decrease, the ability to fit individual word line drivers and decoders within the array pitch is strained, if not impossible, due to the high voltage write requirements for the dense pitch word lines.

Thus, a need exists for a way to accommodate the differing area requirements of subcircuits within a semiconductor chip, without sacrificing density improvements.

SUMMARY OF THE INVENTION

Briefly, the present invention satisfies the need for a way to accommodate the differing area needs of subcircuitry on semiconductor chips, without sacrificing density improvements, by separating the subcircuitries of a semiconductor chip onto separate stacked chips.

In accordance with the above, it is an object of the present invention to provide a way to separate chip functions onto separate stacked chips.

It is another object of the present invention to separate memory array chip functions on to separate stacked chips.

The present invention provides, in a first aspect, a three-dimensional semiconductor chip having a given overall function comprised of a plurality of subfunctions. The semiconductor chip comprises a first semiconductor chip comprising circuitry on a first surface thereof for performing a first portion of the plurality of subfunctions. The semiconductor chip further comprises a second semiconductor chip vertically adjacent the first semiconductor chip, the second semiconductor chip comprising circuitry on a second surface thereof for performing a second portion of the plurality of subfunctions. The semiconductor chip also comprises a plurality of connectors for connecting the first and second semiconductor chips. The plurality of connectors may comprise a plurality of force-responsive self-interlocking microconnectors disposed on each of the first and second surfaces, which may provide either a physical connection alone, or both a physical and an electrical connection. Alternatively, the connectors may comprise a plurality of metal bumps oppositely disposed on each facing surface, with a connecting means connecting corresponding oppositely disposed metal bumps. The connectors may be located in recessed and/or raised areas of the first and second semiconductor chips. In addition to the force-responsive self-interlocking microconnectors, a plurality of repelling members may be included to provide a force-counter-force arrangement to ensure proper electrical connectivity where the microconnectors provide an electrical connection. Also, alignment accuracy may be improved by including force-responsive self-interlocking microconnectors of different sizes. Where the three-dimensional semiconductor chip comprises a memory array, the circuitry of the first chip comprises a plurality of array lines, the second chip comprises a plurality of drivers for driving the array lines, and the plurality of connectors couples the array lines with the drivers.

The present invention provides, in a second aspect, a method for decreasing semiconductor chip area for a semiconductor chip having a given overall function comprised of a plurality of subfunctions. The method comprises steps of: separating circuitry corresponding to the plurality of subfunctions onto at least two vertically adjacent semiconductor chips; and connecting the semiconductor chips, thereby forming a three-dimensional semiconductor chip.

These, and other objects, features and advantages of this invention will become apparent from the following detailed description of the various aspects of the invention taken in conjunction with the accompanying drawings.

BRIEF DESCRIPTION OF THE DRAWINGS

FIG. 7 depicts the fanout for the array of FIG. 6a.

BEST MODE FOR CARRYING OUT THE INVENTION

As a result of EEPROM density improvements, the ability to match the drive circuitry layout to the memory array layout, which requires a relatively high write voltage, has been strained. Such a dense EEPROM array can be found in pending U.S. Patent application, entitled "Three-Dimensional Direct-Write EEPROM Arrays and Fabrication Methods," by Bertin et al. and assigned to IBM, filed Mar. 12, 1992, Ser. No. 07/850,734, which is herein incorporated by reference in its entirety (hereinafter referred to as "the Bertin et al. application"). The Bertin et al. three-dimensional direct-write EEPROM array, by nature of the cell technology, does not require cell erasure before writing. The operating modes are thus read, at 3 or 5 volt levels, and write using 10 to 12 volts applied to the array word lines. A more in-depth description of the EEPROM cell inside a trench can also be found in U.S. Pat. No. 5,196,722 issued to Bergendahl et al. Mar. 23, 1993 and assigned to IBM, entitled "Shadow RAM Cell Having a Shallow Trench EEPROM", which is herein incorporated by reference in its entirety. Other EEPROM technologies also use read and write modes, however, an erasure is required before the write. A read typically uses 5 volts, a write uses 10 to 12 volts and an erase uses −10 volts, all applied to the word lines during the various modes of operation. Such an EEPROM is described in an article entitled "An Experimental 4 Mb Flash EEPROM with Sector Erase", by McConnel et al., IEEE Journal of Solid State Circuits, vol. 26, no. 4, April 1991. High voltage driver requirements for EEPROM arrays are described in an article entitled "A 5 V Only 0.6 μm Flash EEPROM with Row Decoder Scheme in Triple-Well Structure", by Kuriyama et al., 1992 IEEE International Solid State Circuits Conference (ISSCC). In addition to the Bertin et al. application, the invention may also be applied to other types of EEPROM arrays such as those described in the above references.

Figure 1:
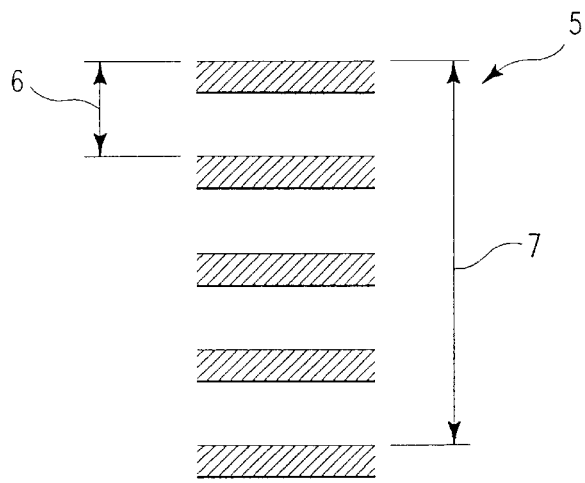
FIG. 1 depicts the word lines of an EEPROM memory array.

FIG. 1 depicts word lines 5 as part of the EEPROM array described in the Bertin et al. application. The word line periodicity 6 (pitch) is 1.3 μm. Fitting individual word line drivers and decoders on such a tight array pitch is usually not efficient. One solution is to drive a larger group of word lines for a more efficient word line driver and decoder layout. In the present embodiment, four word lines are grouped with a combined periodicity 7 of 5.2 μm. Thus, four word line driver and decoder pairs must fit within the 5.2 μm periodicity. As array periodicities continue to shrink due to technology enhancements, and high voltage write requirements must be accommodated, the problem will become more acute. The present invention will be described with reference to the Bertin et al. three-dimensional direct-write EEPROM array, and familiarity therewith will be assumed.

The Bertin et al. three-dimensional direct-write EEPROM array is a non-volatile array requiring a higher driver voltage, so that electrons can tunnel into the floating gate. The higher voltage demand for a write results in driver circuits requiring about twice the space of a conventional driver circuit for an EEPROM array. The larger driver circuits not only take up valuable real estate, but effectively prevent matching with the dense array pitch. The present invention separates the high voltage function from the rest of the EEPROM array and uses a dense contact scheme having smaller contacts than one typically achieved with, for example, solder bump technology.

Figure 2:
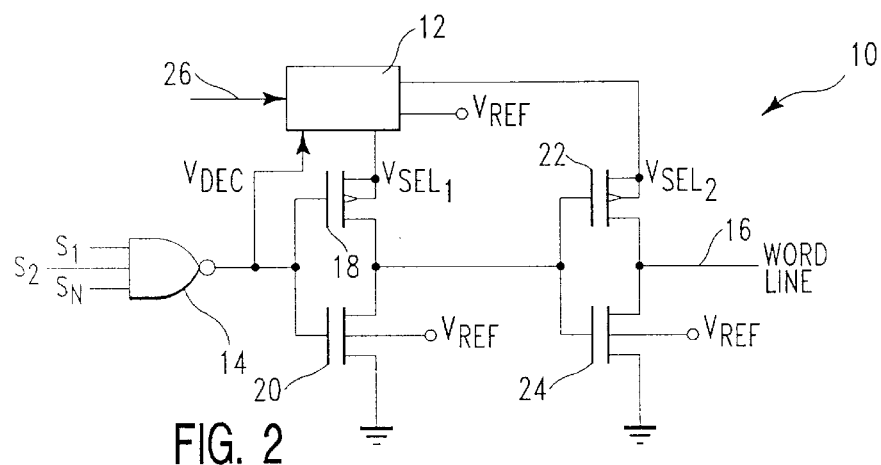
FIG. 2 depicts a high-voltage decoder/word line driver circuit useful in driving the word lines of FIG. 1.

FIG. 2 depicts an exemplary decoder/word line driver circuit 10 useful in driving word lines of the Bertin et al. three-dimensional direct-write EEPROM Memory Array. Driver/decoder circuit 10 comprises on-chip high-voltage generator 12, high-voltage decoder 14, word line 16 and transistors 18, 20, 22, and 24. The basic operation of driver/decoder circuit 10 is similar to that described in an article entitled, "High Voltage Decode/Drivers for EEPROMs," IEEE, ISSCC, 1990, page 56. The word line driver circuit of FIG. 2 operates in the read or write mode. In read mode, the voltage level swings between ground and 5 volts or ground and 3 volts, depending on the system power supply. We will use 5 V in this description, with $V_{ref}=0$, and $V_{SEL1}=V_{SEL2}=5$ V. The decoder inputs, S1 . . . SN, also swing between ground and 5 V in selecting the word line drive circuits. Word line voltage transitions from 0 to 5 V generate an array output on the bit lines as a function of the information ("1" or "0") stored state. The mode signal on line 26 is used to initiate a write. High voltages of 10–12 volts are applied through circuit 12 to $V_{SEL1}$ and $V_{SEL2}$, as well as to the decoder inputs. The output of the decoder 14 also swings from 0 to 12 volts. The reference voltage $V_{REF}$ may be left at zero, which provides a natural undershoot protection of 0.7 V, the silicon junction forward bias threshold value. High-voltage generator 12 may also be designed to supply −1 or −2 volts, for example, to the well 38 of the triple-well NMOS driver transistor 36 (shown in FIG. 3) for increased tolerance to undershoot (voltage swings below the referenced ground level) as the word driver transitions from positive voltage to ground level. This circuit operation meets the requirements of the Bertin et al. three-dimensional direct-write EEPROM array in the Bertin et al. application. This circuit is also capable of supplying −10 volts for erasure for EEPROM arrays requiring it. In this case, the well 38 of the triple-well NMOS driver transistor 36 (shown in FIG. 3) is biased at −10 volts.

Figure 3:
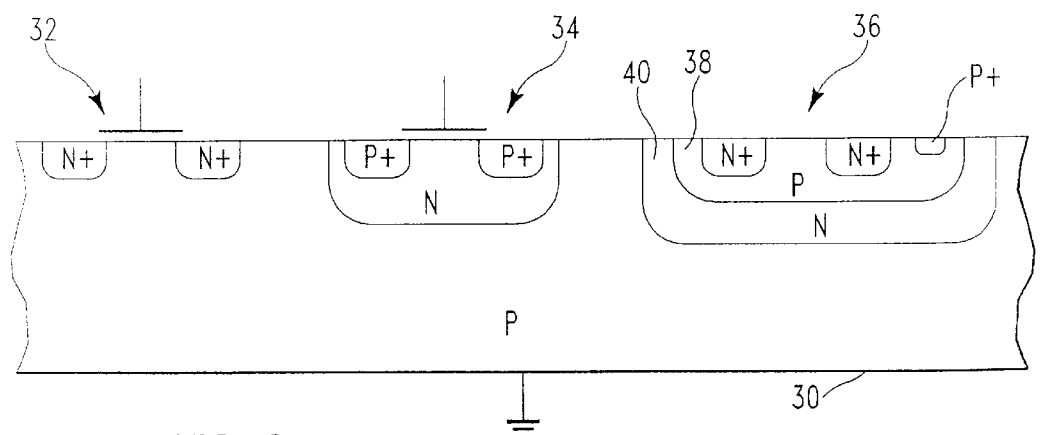
FIG. 3 depicts several different NMOS device structures, including a triple-well device useful in the high-voltage driver of FIG. 2.
Figure 4:
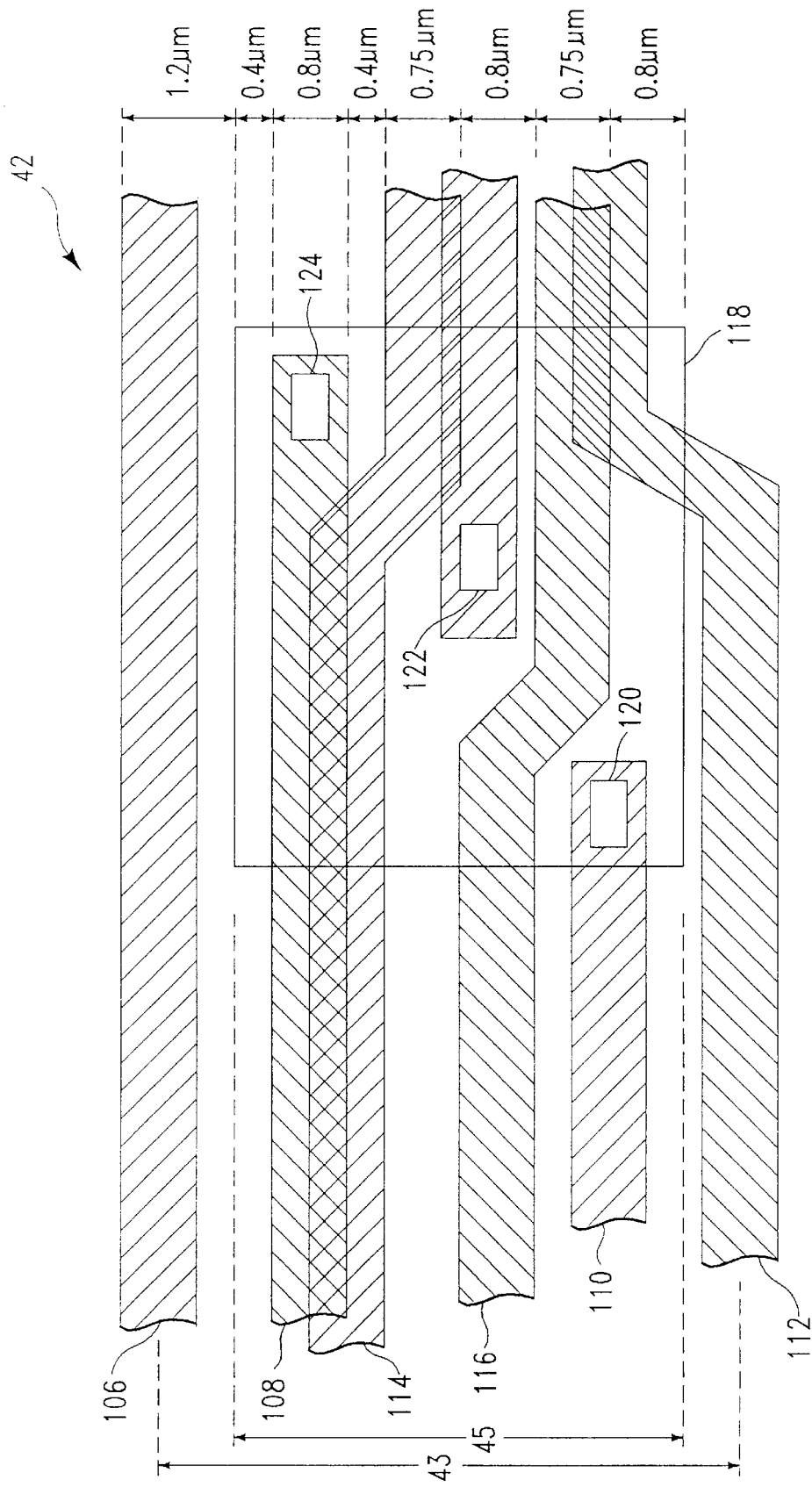
FIG. 4 depicts a top view of a portion of a conventional low-voltage CMOS array driver layout.

FIG. 4 shows a portion of an existing 0.5 micron ground rule CMOS technology layout 42 for a driver with a word line voltage swing from 0 to 3.5 V that will be used as a starting point for a description of this invention. Low voltage transistors, such as 32 or 34 in FIG. 3, would be used. The word drivers (not shown) are in groups of four with a word line periodicity 43 of 5.9 microns. Word lines 106, 108, 110 and 112 are shown with poly gates 114 and 116. N+ diffusion boundary 118 surrounds contact pads 120, 122 and 124. Layout 42 is a composite of several mask levels which include diffusions, metal and oxide layers. Contact pads 120, 122 and 124 interconnect the various layers to form a portion of the drivers. The diffusion boundary is on the order of 22.09 microns² (side 45 being about 4.7 microns), and the contact pads are on the order of 0.25 microns². Device channel lengths are 0.75 μm with gate oxides of 13 nm (130 Angstroms). For word drivers having 10 to 12 volt swings, the CMOS process must be changed and optimized for high voltage operation. A triple-well NMOS device structure, such as that shown in device 36 FIG. 3, is used to accommodate the high voltages. The doping level of the P-well 38 is chosen to accommodate the high voltage requirements during a write. An N-well 40 is introduced to decouple the P-well bias from the grounded P-substrate 30. This permits undershoot (word line below ground) voltage level without increased current drain for the direct write EEPROM cell. Undershoots of 1 or 2 volts can be accommodated. The triple-well structure allows the invention to be applied to EEPROM arrays with erase-before-write requirements as well, where word lines can be as negative as 10 volts below the reference voltage (or ground) level with $V_{SEL1}=V_{SEL2}0$ V.

The layout 42 of the existing word line drive transistors increase to accommodate the high voltage requirements. The dimensions of the drive circuit perpendicular to the word line array are of prime interest. Unique voltages, both positive and negative, are generated on EEPROM chips as described in the referenced material and are available for driver and select circuits. Minimum device channel lengths of 1.4 μm and gate oxides of 30 nm (300 Angstroms) are called for. Minimum spacings of 1.4 μm are used in the thick oxide regions between transistors to prevent parasitic leakage currents. Non-high-voltage devices remain at 0.75 μm channel lengths and 13 nm (130 Angstrom) thicknesses.

Figure 5:
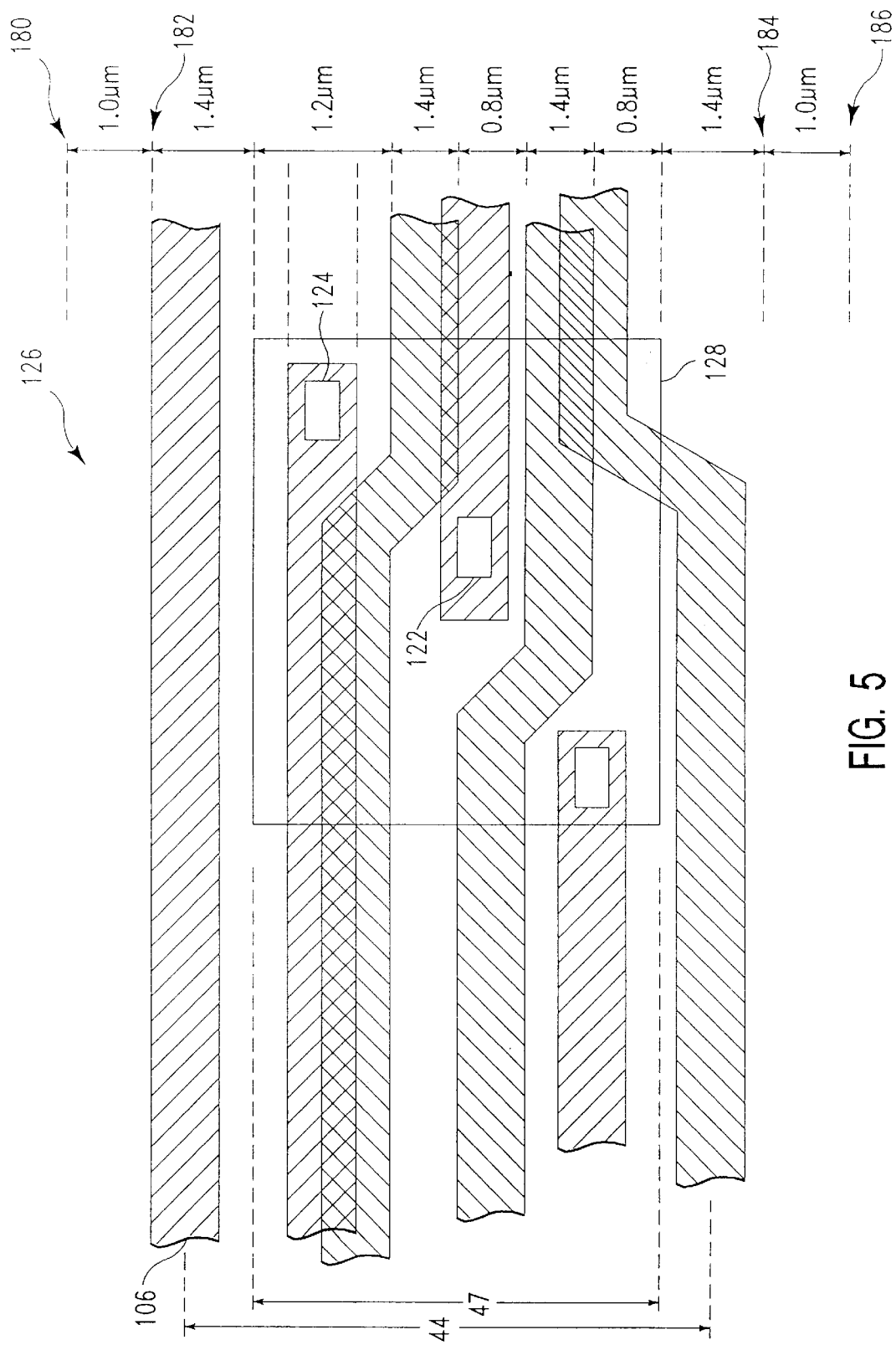
FIG. 5 depicts a top view of a portion of a high-voltage EEPROM array driver layout derived by substituting the high-voltage transistor of FIG. 3 into the layout of FIG. 4.

FIG. 5, which is not drawn to scale, depicts layout 126, obtained by substituting larger high-voltage triple-well NMOS FETS, such as transistor 36 in FIG. 3, for the smaller low-voltage FETs of layout 42 in FIG. 4. The larger FETs cause the word line periodicity 44 to grow to 10.4 μm (and side 47 of N+ diffusion boundary 128 to grow to 5.6 microns), while the EEPROM array word line requirement remains 5.2 μm, as shown in FIG. 1. Thus, the word line periodicity is twice as large as the EEPROM array word line requirement. The P-well boundaries are shown at 182 and 184, while the N-well boundaries are shown at 180 and 186.

The present invention provides a way to maintain the pitch of the word lines and bit lines coming from a three-dimensional direct-write EEPROM array by separating the drivers (and their associated decoders) from the rest of the EEPROM array onto another chip which is stacked therewith face to face. The separation of the drivers allows different technologies (i.e., low and high voltage) to be used for the array and for the drivers. The separation also allows for maximizing the space design of each chip and allows a design that stays within the array pitch, and may actually use less space.

Figure 6A:
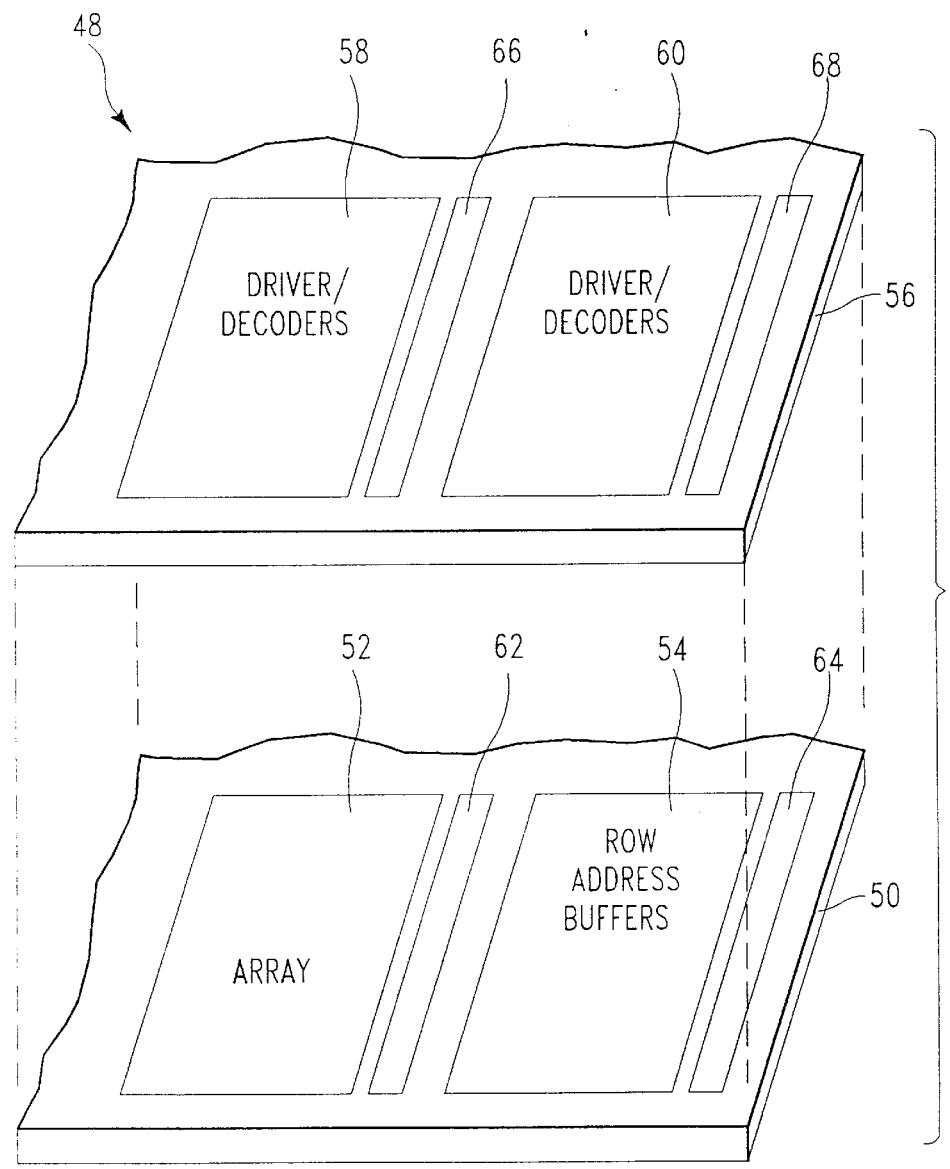
FIG. 6a depicts a three-dimensional direct-write EEPROM memory according to the present invention.

FIG. 6a depicts a three-dimensional direct-write EEPROM memory 48 according the present invention. EEPROM memory 48 comprises bottom chip 50, including array 52 on the left-hand side thereof and row address buffer 54 on the right-hand side thereof. Array 52 contains storage bits, word lines, and bit lines. EEPROM memory 48 also comprises top chip 56, including high-voltage decoder/drivers (of FIG. 2) on either side 58 and 60 thereof. Assuming a total word line pitch of 5.2 microns, the high-voltage decoders are split on either side of top chip 56 in order to match the word line pitch (10.4 microns÷2=5.2 microns). EEPROM memory 48 also comprises exemplary microconnector regions 62, 64, 66 and 68. The decoders and drivers on top chip 56 send the drive signal to bottom chip 50 via microconnectors in areas 66 and 62. Similarly, row address buffer 54 sends the address from bottom chip 50 to top chip 56 via microconnectors in areas 64 and 68.

Although not shown in FIG. 6a, it will be understood that bit lines and their associated drivers, decoders and sense amp (see FIG. 10) would be included, but need not be separated onto different chips as with the word lines, although they could be, since the bit line driver/decoders can fit on pitch. Thus, the bit lines and associated circuitry could, for example, be included in bottom chip 50. In addition, the bit lines have voltage swings in the 3–5 volt range and match the array pitch on the bottom chip.

Figure 7:
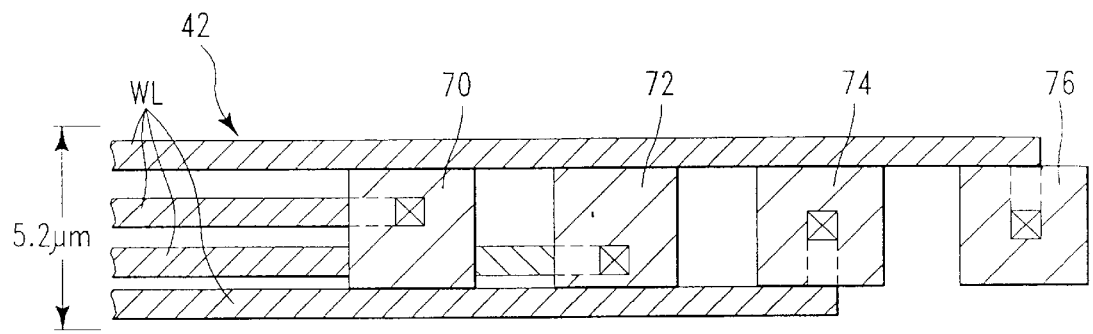

FIG. 7 depicts the word line fanout of array 52 implemented in the bottom chip 50 of three-dimension direct-write EEPROM memory 48 in FIG. 6a. Shown in FIG. 7 are connection pads 70, 72, 74 and 76.

A further densification is obtained by placing microconnectors on top of the array (with via connectors to the word lines below), eliminating the need for pads extending beyond the circuit or array regions. Similarly, microconnectors are placed directly over and connected to driver/decoder circuits. In this scheme, connection between the driver/decoder circuits on the upper chip and the array on the lower chip is exclusively over the array region, saving significant chip area. In particular, microconnector regions 62, 64, 66 and 68 of FIG. 6a and the fanout region of FIG. 7 are eliminated.

Further advantage is achieved because the space above the array is large enough to accommodate substantially larger pads than would fit within the boundaries of the fanout pitch of FIG. 7. Thus, both larger pads and higher density are achieved.

By way of example, a typical array region is 5 by 10 millimeters, or 50 square millimeters, and contains 4096 word lines. A pad, which forms the base of an array of microconnectors, is 10 by 20 micrometers, or 200 square micrometers (0.0002 square millimeters). With one pad connected to each word line, the total area devoted to pads for each array region is 4096×0.0002=0.82 square millimeters. Thus, the microconnector area is 1.6 percent of the array area.

A set of four drivers/decoders and interconnections occupy approximately 10.4 by 160 micrometers, or 1,664 square micrometers (0.0017 square millimeters). The total area required for 4096 driver/decoders is 4096/4×0.0017= 1.7 square millimeters, or 3.4 percent of the array area. Since the row address buffers which connect to the driver/decoders are also much smaller than the array, all driver/decoders and row address buffers can easily fit in the space of the array.

Figure 6B:
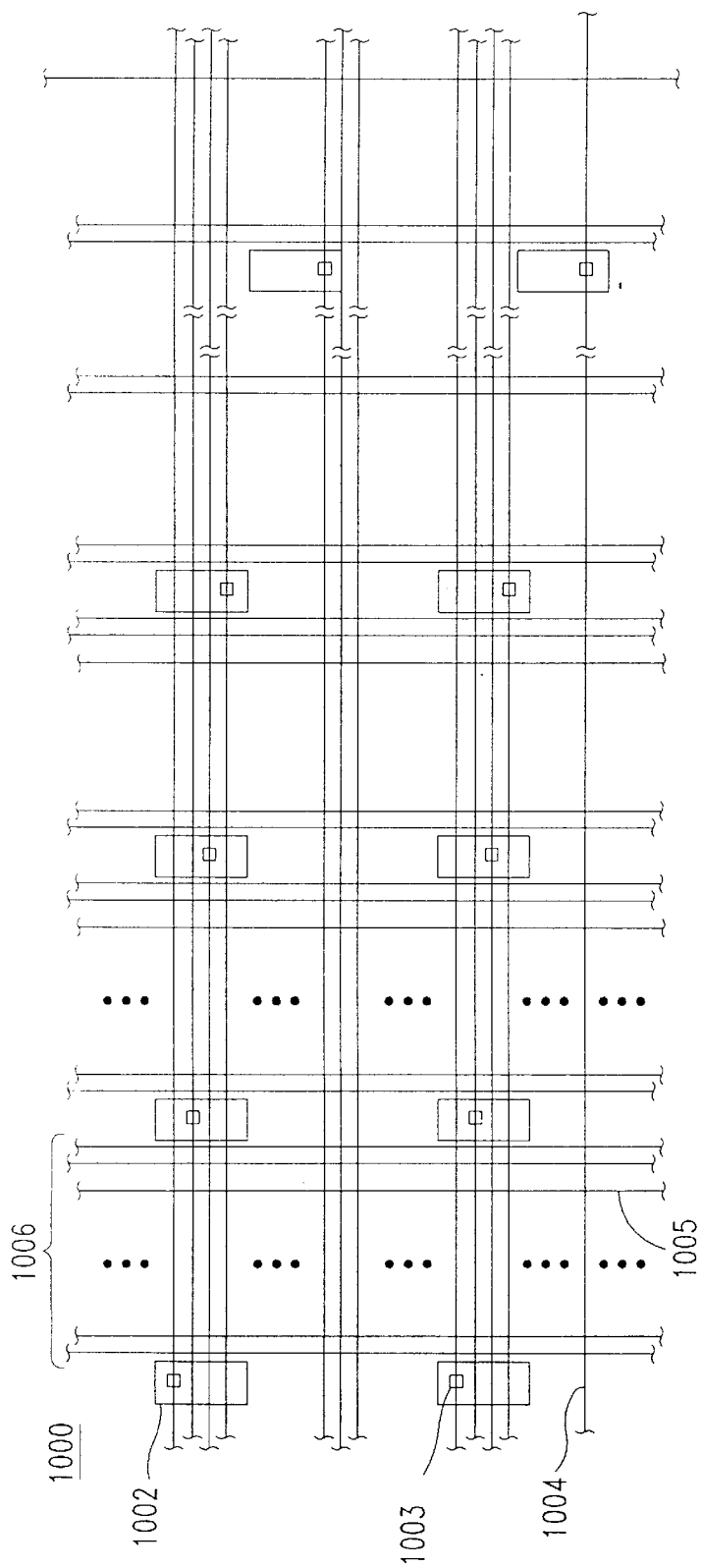
FIG. 6b depicts a memory array top view with contact pads above the array region, requiring no fanout beyond the array boundaries.

Advantageously, as shown in FIG. 6b, described in more detail hereinbelow, there is room above the array to make the pads with microconnectors much larger than the 10×20 micrometers of FIG. 7. By increasing dielectric thickness between the pads and the array bit or word lines to a few micrometers, it is also possible to minimize loading and electrical coupling while increasing pad size substantially, so that they do overlap the bit lines and more of the word lines. With thick dielectric, for example, pads with microconnectors could grow to 25 by 50 micrometers, providing space for more microconnectors or larger microconnectors on each pad: while a 10 by 20 micrometer pad has room for 8 microconnectors, each each 5 by 5 micrometers, a 25 by 50 micrometer pad has room for 50 microconnectors.

Figure 6C:
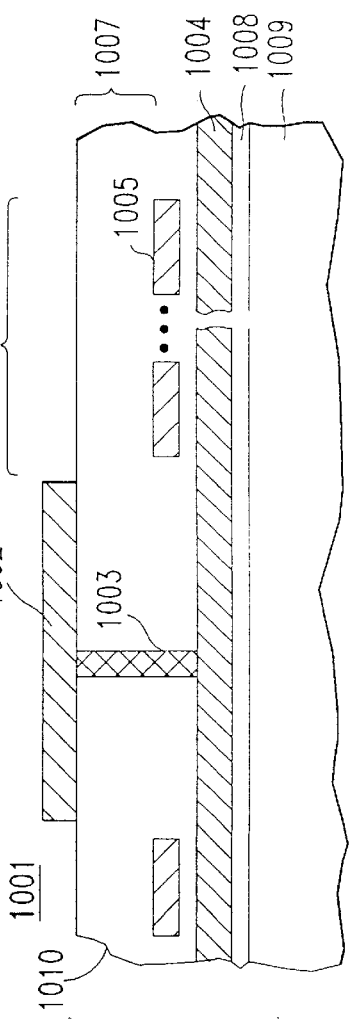
FIG. 6c depicts a cross-section of the layout 6b.

FIG. 6b shows a top view of array layout 1000. Word lines 1004 and bit lines 1005 are shown as stick figures. They are also shown in cross section 1001 of FIG. 6c. Pads 1002 could be 10 by 20 micrometers with each pad contacting word line 1004 through via hole contact 1003. Bit lines 1005 could be in groups 1006. The array layout of FIG. 6b shows pad 1002 on the surface of dielectric 1010. The distance 1007 between pad 1002 and top of bit lines 1005 is not critical because there is no pad-bitline overlap, and therefore no significant capacitive coupling between pad 1002 and bit lines 1005 through dielectric 1010. Oxide layer 1008 separates word lines 1004 from silicon substrate 1009 which contains the integrated circuits. Thus, there is sufficient space to arrange pads to avoid overlapping bit lines, avoiding increased capacitive loading through dielectric 1010. And, while pads overlap portions of wordlines, the amount of overlap of wordlines is minimal.

Figure 6D:
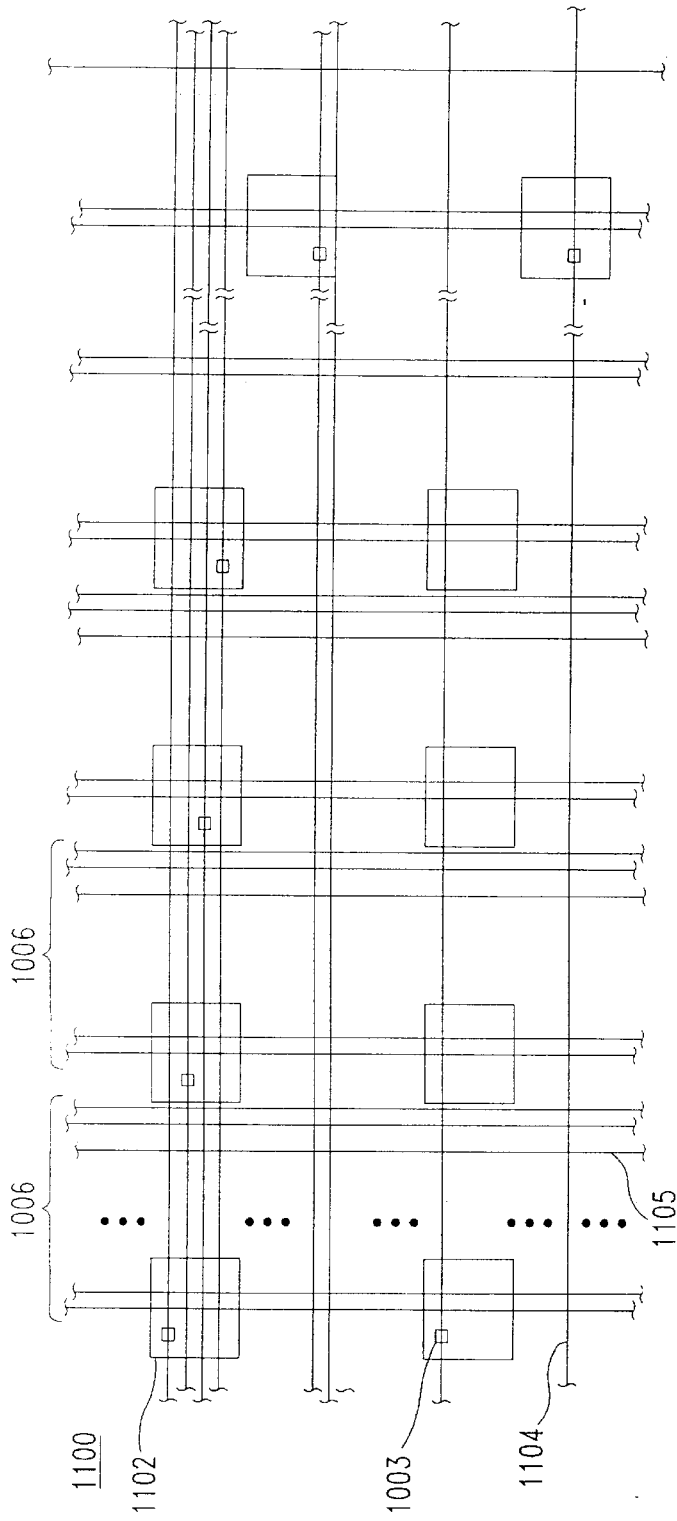
FIG. 6d depicts a memory array top view similar to FIG. 6b but with larger pads above the array region.
Figure 6E:
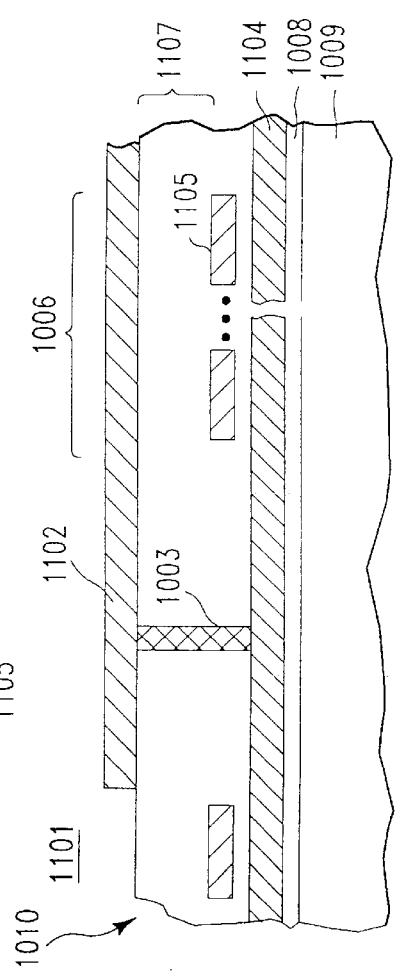
FIG. 6e depicts a cross-section of the layout 6d.

FIGS. 6d–6e show array 1100 with larger pads 1102, having dimensions of 25 by 50 micrometers, for example. Pad 1102 now overlaps a portion of bit lines 1105. Overlap of word lines 1104 is substantially greater than in the implementation of FIGS. 6b–6c. Separation distance 1107 is adjusted to reduce capacitance coupling between pads 1102 and bit lines 1105 through dielectric 1110 to acceptable levels. A separation distance of 5 micrometers could be used, for example.

Figure 6F:
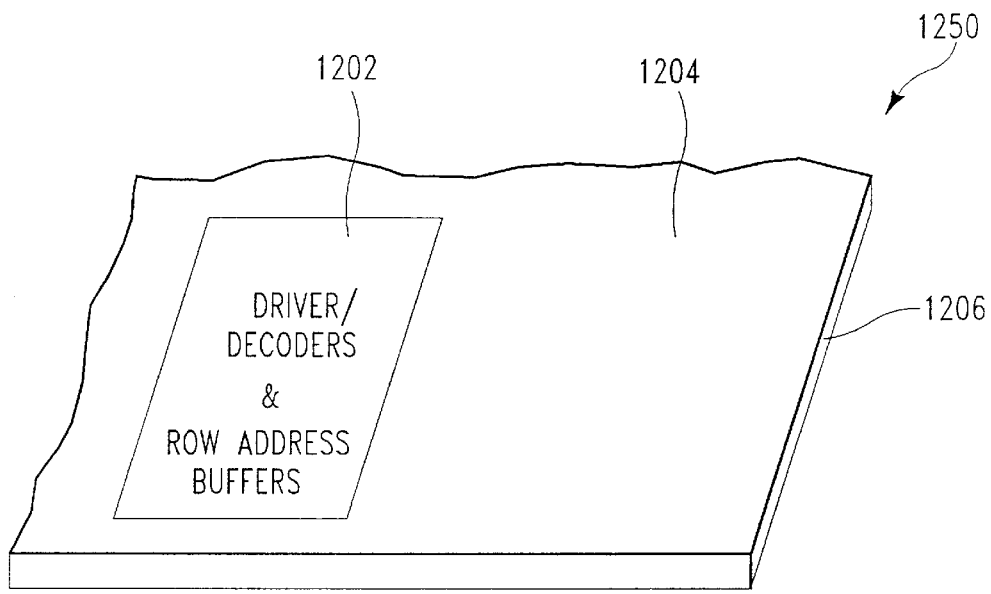
FIG. 6f depicts an alternate embodiment of a three dimensional direct write EEPROM memory according to the present invention.
Figure 6G:
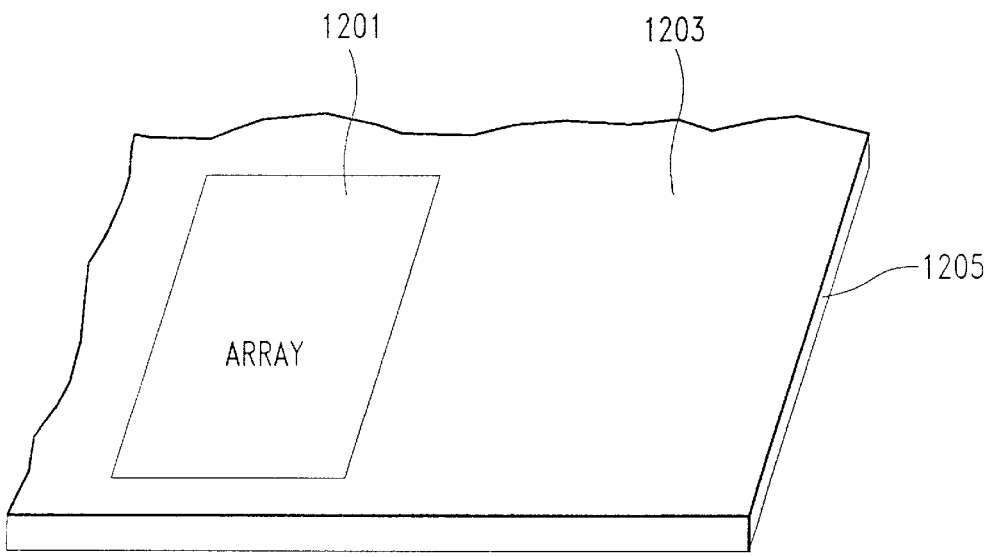

EEPROM memory layout 1250, shown in FIG. 6f, shows the improved densification possible with the approach illustrated in FIGS. 6b–6c or FIGS. 6d–6e. Chip 1205 contains array region 1201 with word lines, bit lines, pads, and microconnectors as described in those figures. Row address buffer 54, of FIG. 6a can now be located on chip 1206, and microconnector regions 62 and 64 are now located on pads over array region 1201. Region 1203 of chip 1205 is no longer populated with circuits or electrical contacts. Thus, chip 1205 can either be smaller than chip 50 of FIG. 6a or additional memory array or logic function, such as microcontroller, microprocessor or application specific integrated circuits can be added. Chip 1206 contains both driver/decoder circuits 58 and 60 of chip 56 and row address buffers 54 of chip 50, consolidated in a combined driver/decoder and row address buffer circuit area which all fits in space over array 1201. This space also includes pads and microconnectors for electrically connecting circuits 1202 and 1201. With the consolidation of driver/decoder circuits and the elimination of microconnector regions 66 and 68, region 1204 of chip 1206 contains no circuits and no electrical contacts. The region can be eliminated, reducing the size of chip 1206, or additional electronic function could be added, as described above for chip 1205.

The microconnectors of the present invention can provide electrical connectors, mechanical connectors, or combined electrical and mechanical connectors as described herein and in related patent applications BU9-94-109 and BU9-94-110, incorporated herein by reference. While chip to chip contact has been described in terms of front face to front face contact (the front face of the chip being the face containing the active circuits), chips can also be connected front face to back face if at least one chip contains electrical trench contacts to bring contact from a pad on the back through the chip to the device area on the front. Thus, it could be advantageous to locate contact pads and microconnectors on both front and back surfaces of chip so a large number of chips may be connected front to back to form a stack.

A preferred embodiment and alternate embodiment for microconnectors useful with the EEPROM memory of the present invention on pads in regions 62, 64, 66, and 68 (FIG. 6a) or in regions 1201 and 1202 (FIG. 6f) will now be described in detail. Conventionally, connection pads are made of titanium, aluminum, copper or tungsten. Each connection pad is to contain one or more microconnectors for connecting with top chip 56. Similar connection pads would also be present on top chip 56. Each connection pad is sized on the order of three to four microns square. Preferably, more than one microconnector is placed on each pad to ensure proper connection. The microconnectors are formed onto the pads during the semiconductor fabrication process, and are thus fully integrated with the pads.

Figure 8:
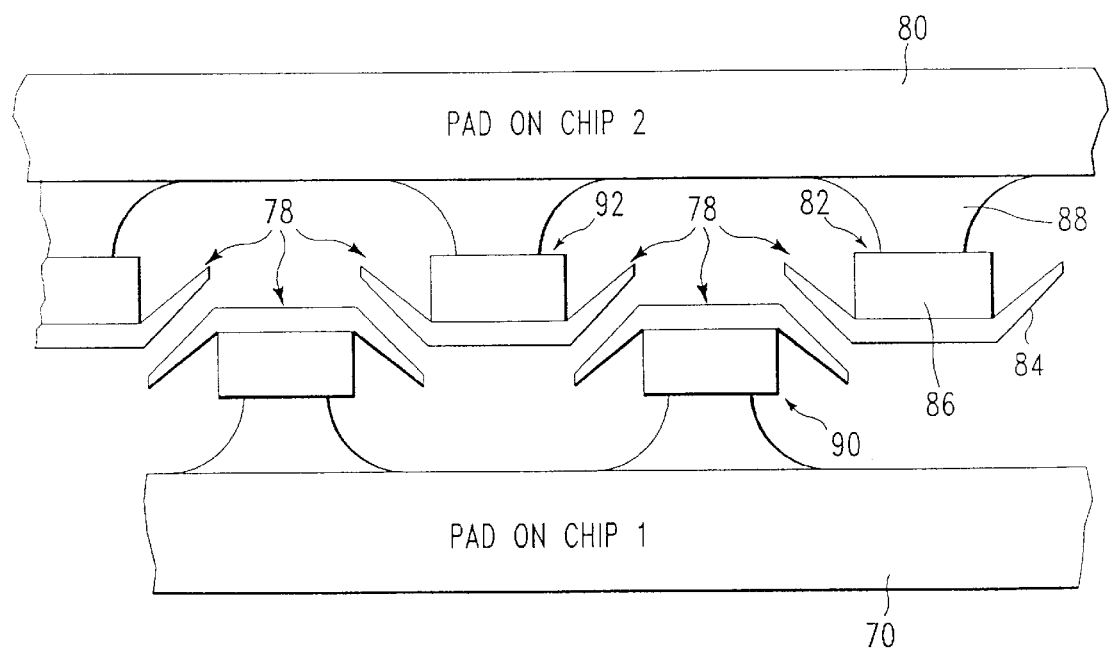
FIG. 8 depicts one embodiment of connectors used to connect the stacked chips of FIG. 6.

Preferably, the microconnectors take the form of force-responsive self-interlocking microconnectors that provide both a physical and an electrical connection. FIG. 8 depicts a preferred embodiment of force-responsive self-interlocking connectors 78 (hereinafter, referred to as "FSCs"). The FSCs shown in FIG. 8 reside on the normal surface of the chip on connection pad 70 and a corresponding connection pad 80 on top chip 56. Each FSC, such as FSC 82, comprises a flexible top 84, post 86 and stem 88. The FSCs may be made of, for example, aluminum, copper or other suitable materials. As bottom chip 50 and top chip 56 are pressed together, the FSC flexible tops bend to allow the insertion of one FSC on a first pad between two FSCs on a second pad. For example, as the chips are pressed together, FSC 90 is inserted between FSCs 82 and 92, with the flexible top of each bending to allow same. Once the flexible top of FSC 90 has cleared the flexible tops of FSCs 82 and 92, the FSCs self-interlock. The more FSCs that are used, the more reliable the physical connection between the chips will be. The FSCs can be analogized to hook-and-loop type closures used for various purposes.

As will be discussed in more detail subsequently, FSCs may be created in apertures by semiconductor processing on a substrate. However, if the FSCs are created in apertures in the normal surface of a chip, when the chips are brought together, the FSCs will not touch, since the normal surface of the chips would lie at the top of the FSCS. In accordance with the present invention, "channels" (i.e., insets and/or mesas) are useful in ensuring that the FSCs come into proper contact with each other. In one embodiment, a channel is a raised region or mesa on which the FSCs are formed. In another embodiment, a channel takes the form of an inset or aperture in a chip in which FSCs are formed.

Figure 9:
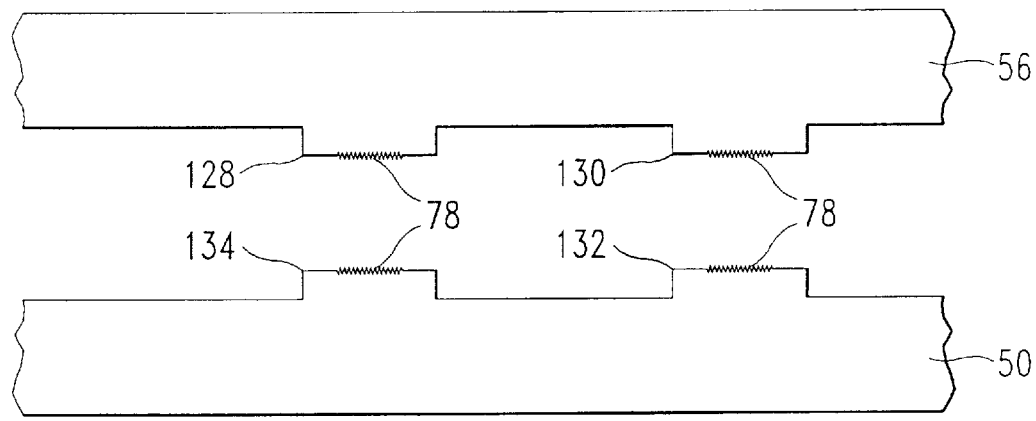
FIG. 9 depicts the connectors of FIG. 8 on raised areas of stacked chips to ensure a proper connection.
Figure 10:
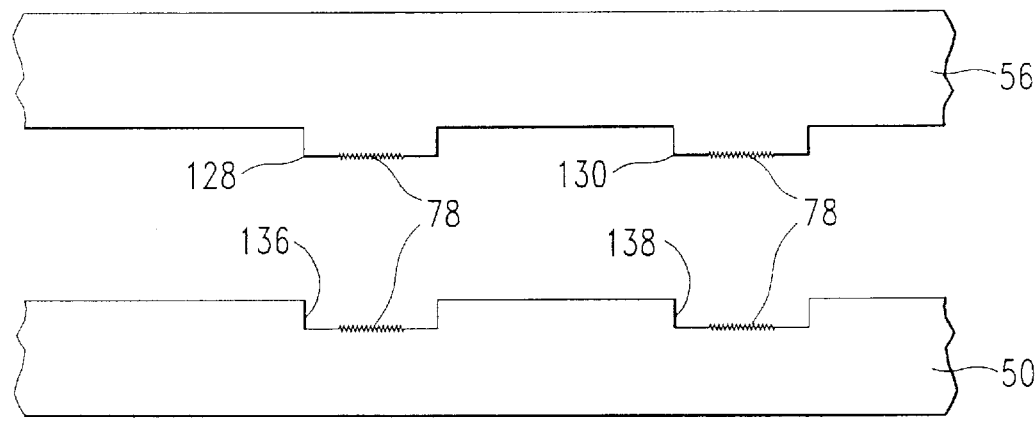
FIG. 10 depicts the connectors of FIG. 8 both on raised areas and in mating recessed areas of stacked chips to ensure a proper connection.

FIG. 9 depicts the use of oppositely disposed pedestals on chips 56 and 50 to ensure a proper connection of the microconnectors. Shown in FIG. 9 are pedestals 128, 130, 132 and 134, on which FSCs 78 are created. FIG. 10 depicts the use of a pedestal-inset pair to ensure a proper FSC connection. When chip 56 is placed on top of chip 50, pedestal 128 fits into inset 136, and pedestal 130 fits into inset 138. Depending on the height of a pedestal in a pedestal-inset pair, as compared to the inset, one can create a gap between chips 50 and 56 if desired. In the example of chip function separation described herein, the use of two pedestals, as shown in FIG. 9, is preferred, since it allows for common processing of the chips and provides a clear gap between the chips for clearance between the oppositely facing circuitries thereof. Note that more than two layers of chips could be used with channels on either side of the interior chips of the stack. Two chips are depicted in FIGS. 9 and 10 for ease of illustration only. A gap of predetermined dimensions may be used for the flow of a liquid or gas for cooling purposes as needed.

In order to minimize the disturbance to the circuitry on a chip, one needs to decide whether to build the FSCs prior to normal chip processing or after. When making an inset in a chip, it is preferably done prior to normal chip processing. Once the inset is made, and the FSCs made therein, the channel could be filled with, for example, an oxide film prior to normal chip processing. After normal chip processing, the oxide film could be removed without damage to the FSCs from the normal chip processing. By similar rationale, FSCs on a mesa are preferably made after normal chip processing, since the chip circuitry could be covered to protect it during the making of the FSCS.

Figure 11A:
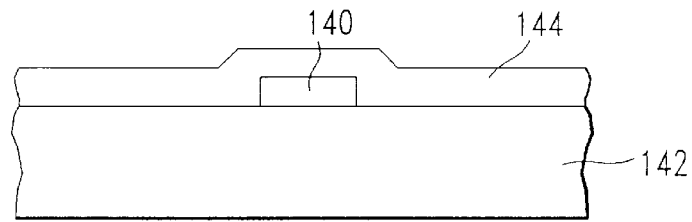
FIGS. 11a–11f depict a connector of FIG. 8 at various stages of processing.
Figure 11B:
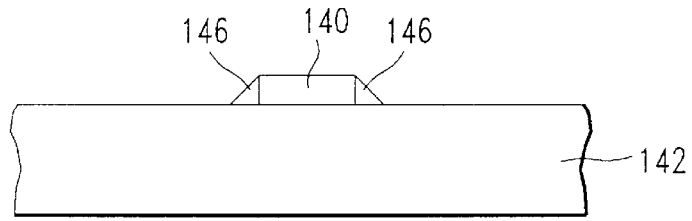
Figure 11C:
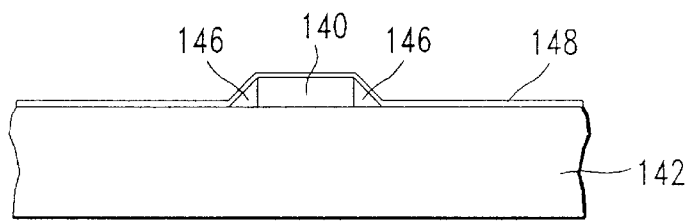
Figure 11D:
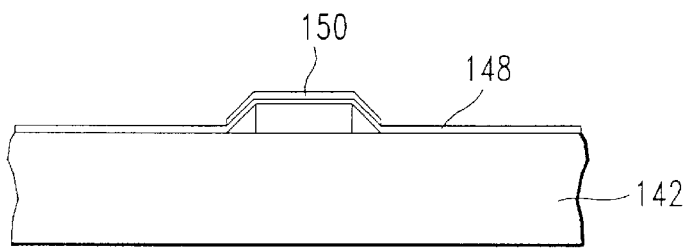
Figure 11E:
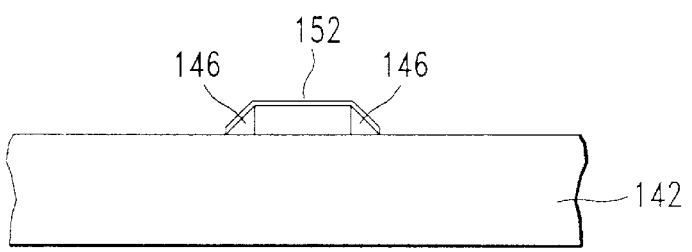
Figure 11F:
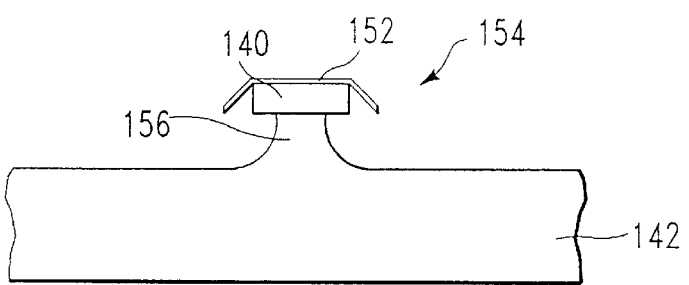

A general description of the process for making an FSC will now be discussed. Subsequently, possible materials for use in the described process of making will be listed. FIG. 11a depicts a cross-sectional view of a block or post 140 created on a substrate or base 142. Material 144 is deposited over post 140 and base 142 such that a slope is created on the side walls of post 140. This might be done, for example, by spin applying material 144. After depositing material 144, it is then directionally etched back to define mandrel flair-out portions 146 shown in FIG. 11b. Note that the directional etch need not be selective to base 142. As shown in FIG. 11c, a conformal material 148 is applied over the post 140 and mandrel flair-out portions 146. A mask 150 is then created over conformal material 148 covering post 140 and mandrel flair-out portions 146, as shown in FIG. 11d. The mask 150 may be created by depositing a layer of material and etching portions beyond the area above post 140 and mandrel flair-out portions 146. The portion of the conformal material 148 not covered by mask 150 is etched away, and the mask is removed. As shown in FIG. 11e, this creates flexible top 152. Base 142 and mandrel flair-out portions 146 are then etched away to form FSC 154 (shown in FIG. 11f), comprised of flexible top 152, post 140 and stem 156 on top of what is left of base 142 after creating stem 156.

The materials chosen for the various sections of FSC 154 shown are preferably chosen such that the material used for flexible top 152 adheres well to post 140, post 140 adheres well to stem 156, and stem 156 adheres well to base 142. Mandrel flair-out portions 146 are preferably removable without affecting flexible top 152. Stem 156 and base 142 need not be the same material, although they could be. If different materials, a different etch may be needed for each. Also, post 140 is preferably of a different etch characteristic than mandrel flair-out portions 146, if retention of the shape of post 140 is desired. If post 140 and stem 156 were the same material, the etch to create stem 156 would create a semicircle from base 142 up to flexible top 152, since post 140 would also be etched. The choice of materials will of course depend on the situation.

The chart below illustrates different possible combinations of materials that can be used for each part of FSC 154. For mechanical connectors on an oxide-insulated chip case 1 provides the simplest materials. Spin-on glass is relatively inexpensive and nitride is very flexible and has a low etch rate relative to oxide. On the other hand, if the chip is insulated with polyimide, case 11 would be preferred for mechanical connectors. For electrical connectors, post, top, stem, and base need include conductors, as provided in cases 19, 20, 24, and 25.

TABLE 1

MATERIALS

| | POST | MANDREL FLAIR-OUT PORTIONS | FLEXIBLE TOP | STEM | BASE |
|---|---|---|---|---|---|
| Case 1 | nitride | spin-on glass | nitride | oxide | oxide |
| Case 2 | nitride | spin-on glass | metal | oxide | oxide |
| Case 3 | metal | spin-on glass | metal | oxide | oxide |
| Case 4 | nitride | spin-on glass | nitride | oxide (fast etch) | oxide (slow etch) |
| Case 5 | nitride | spin-on glass | metal | oxide (fast etch) | oxide (slow etch) |
| Case 6 | metal | spin-on glass | metal | oxide (fast etch) | oxide (slow etch) |
| Case 7 | nitride | spin-on glass | nitride | silicon | silicon |
| Case 8 | nitride | spin-on glass | metal | silicon | silicon |
| Case 9 | metal | spin-on glass | metal | silicon | silicon |
| Case 10 | oxide | spin-on glass | nitride | polyimide | polyimide |
| Case 11 | nitride | oxide | nitride | polyimide | polyimide |
| Case 12 | oxide | oxide | nitride | oxide | polyimide |
| Case 13 | polyimide | spin-on glass | nitride | polyimide | polyimide |
| Case 14 | oxide | spin-on glass | metal | polyimide | polyimide |
| Case 15 | nitride | oxide | metal | polyimide | polyimide |
| Case 16 | oxide | oxide | metal | oxide | polyimide |
| Case 17 | polyimide | spin-on glass | metal | polyimide | polyimide |
| Case 18 | metal | oxide | nitride | metal | metal |
| Case 19 | metal | oxide | metal | metal | metal |
| Case 20 | metal | polyimide | metal | metal | metal |
| Case 21 | metal | spin-on glass | oxide | metal | metal |
| Case 22 | nitride | spin-on glass | nitride | metal | metal |
| Case 23 | metal | oxide | nitride | metal type 2 | metal type 1 |
| Case 24 | metal | oxide | metal | metal type 2 | metal type 1 |
| Case 25 | metal | polyimide | metal | metal type 2 | metal type 1 |
| Case 26 | metal | spin-on glass | oxide | metal type 2 | metal type 1 |
| Case 27 | nitride | spin-on glass | nitride | metal type 2 | metal type 1 |

In the table above, "metal type 1" and "metal type 2" are simple metals with etches selective to each other, for example, aluminum and tungsten.

Figure 12:
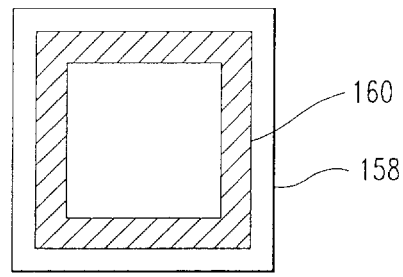
FIG. 12 depicts the connectors of FIG. 8 in one continuous channel (i.e., a recessed or raised area) around the outer edge of a chip.
Figure 13:
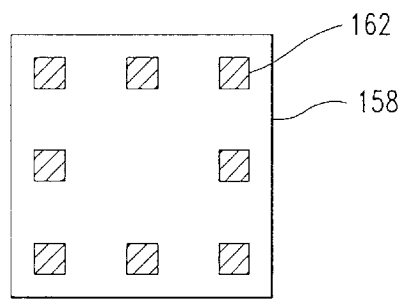
FIG. 13 depicts the connectors of FIG. 8 in multiple channel areas around the outer edge of a chip.

The microconnector areas shown in FIG. 6a are merely exemplary, and can take many other forms. For example, FIG. 12 depicts a top view of a chip 158 with a continuous channel 160 thereon. Channel 160 may not be the optimum choice where wires must come out from chip 158. As another example, FIG. 13 depicts a top view of chip 158 with localized channels 162 placed toward the edges of chip 158. Note that the shape of channels 160 or 162 could be different, depending on the need.

An electrical connection between stacked chips can be accomplished by an electrical connection separate from the FSCs, or by choosing the materials for the FSCs such that the FSCs themselves act as conductors. For a separate electrical connection, a reflowable connection is preferably used. A "reflowable connection" is one where the connection is made after heat is applied, for example, a small ball of solder heated to flow and connect between the two chips. Only a small amount of the reflowable material would be needed to give an electrical connection, since the FSCs actually provide the mechanical strength holding the chips together. The FSCs themselves may act as electrical conductors if the materials for the flexible top, mandrel stem and base are all electrical conductors, such as Case 19 in the table above.

Figure 14:
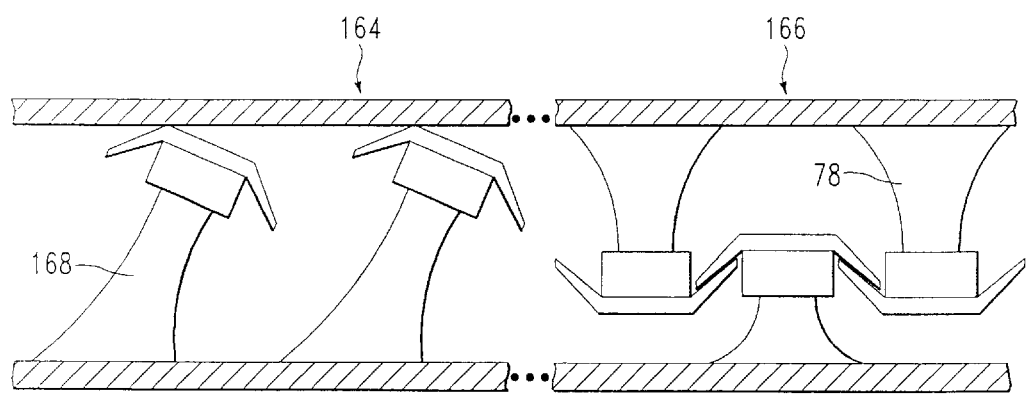
FIG. 14 depicts the connectors of FIG. 8 with repelling members on the same chip stack to provide a force-counterforce arrangement.

To ensure a proper electrical connection, the present invention includes a force-counter-force connection to ensure that the FSCs remain in proper contact. FIG. 14 depicts repelling member area 164 and FSC area 166, both part of a pair of stacked chips according to the present invention. Repelling member area 164 comprises repelling members 168 shown with a slight bend, providing the pushing force countering the FSCs in area 166. Repelling members 168 resemble FSCs, except that their stem is longer and they do not interconnect. The FSCs in area 166 are those described with respect to FIG. 8, and provide the restraining action against the repelling members in area 164. Where the stacked chips include both areas 164 and 166, which act against each other, proper contact ensuring an electrical connection is maintained. In addition, the repelling members in area 164 may or may not be conductive, regardless of whether the FSCs in area 166 are conductive. One approach is to include conductive repelling members 168 on pads 70, 72, 74 and 76 of FIG. 7 with FSCs on another portion of the chip.

Figure 15:
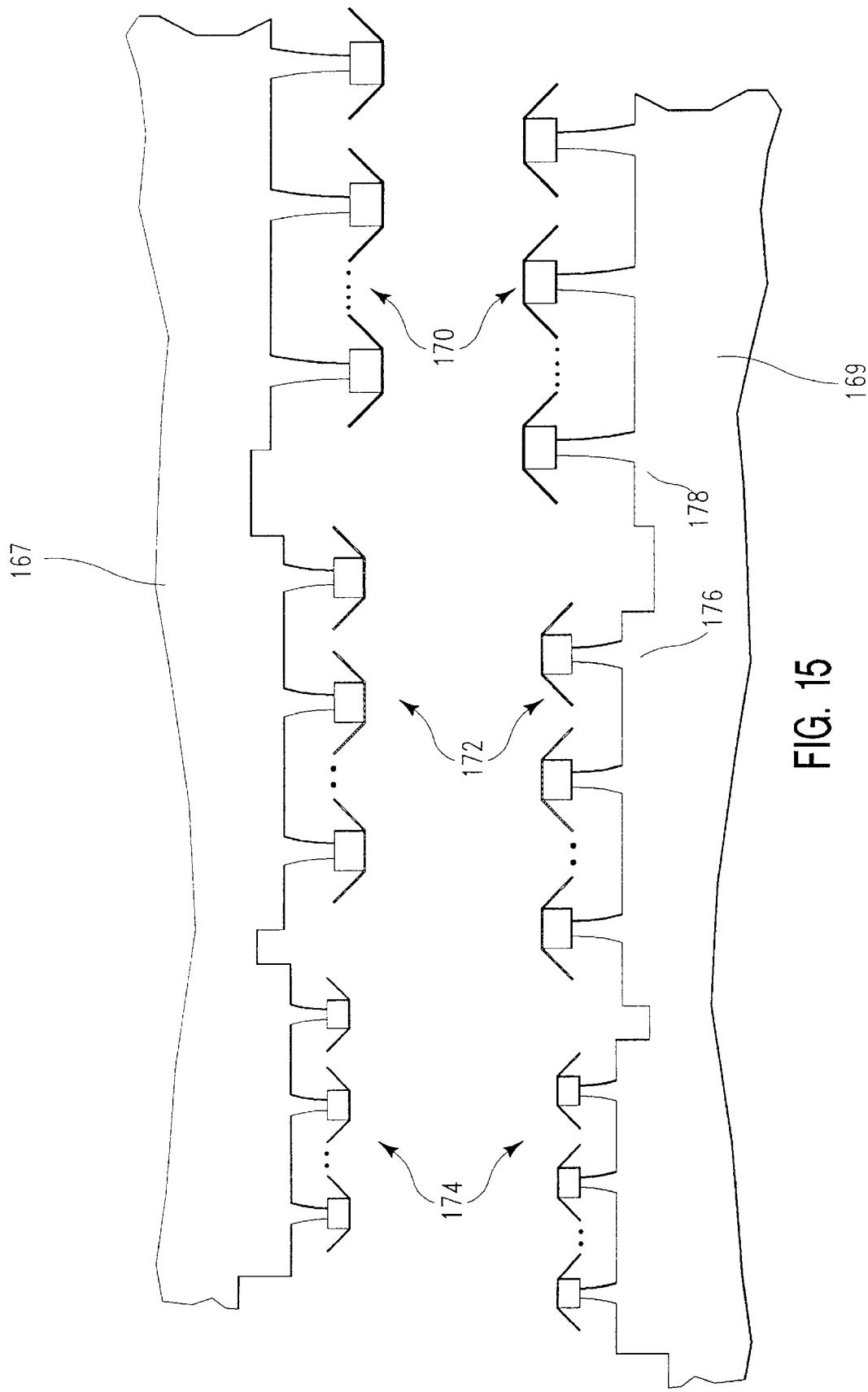
FIG. 15 depicts varying sizes of the connectors of FIG. 8 to provide gross to fine alignment of chips when stacked.

When stacking certain chips face to face, such as the EEPROM array described herein, alignment may need to be very precise. When stacking a circuitry face to a circuitry face, it is difficult to view and align the stacked chips, unless some system such as optical alignment is used. Alternatively, including FSCs of differing heights will help to align the chips in varying degrees as they are being pushed together. FIG. 15 depicts top chip 167 and bottom chip 169 with large FSCs 170, medium FSCs 172 and small FSCs 174. Note that the mesa 176 for medium-sized FSCs 172 is higher than mesa 178 for large FSCs 170. If the mesas were not of differing heights, the medium and small FSCs would never touch when large FSCs 170 are locked into place. Large FSCs 170 provide gross alignment, medium FSCs 172 provide medium alignment, and small FSCs 174 provide a fine alignment. Larger FSCs are both wider and longer than smaller ones. The width can be controlled by the size of post 140 and mask 150. The height can be controlled by the etch done between FIGS. 11e and 11f to create stem 156. In addition, material 148 for the flexible tops could be thicker to make the FSCs taller, and thinner to make them shorter. Although thicker, flexibility is not seriously affected, since the flexing extension portion is wider than it is with the smaller FSCs.

An alternative microconnector structure and method of making same can be found in U.S. Pat. No. 5,202,754, entitled "Three-Dimensional Multi-Chip Packages and Methods of Fabrication," issued to Bertin et al. on Apr. 13, 1993, and assigned to IBM, which is herein incorporated by reference in its entirety. A highly conductive material, such as gold, is placed on a given connection pad. A thermid adhesive material may then be used to keep the gold bumps on the pads of chips 50 and 56 in contact.

Briefly, the gold could, for example, be deposited by sputtering. A thin layer of titanium, on the order of 1000 angstroms, is evaporated onto a pad, then gold is sputtered on relatively thick, for example, 3–4 μm. Using any of several conventional methods, the insulating thermid adhesive, compatible with polyimide-type dielectrics, is deposited on the gold bumps. A combination of pressure and temperature (less than 400° C.) causes the thermid adhesive to flow away from the contact area, and causes slight deformation of the gold bumps. Once the thermid adhesive cools, it bonds and holds the gold bumps in contact. The connection structure of U.S. Pat. No. 5,202,754 includes the use of a filled trench technology to achieve a front-to-back connection, which is not necessary in the present invention, since it is preferably a front-to-front connection. However, access to the back side of chips 50 and 56 could be provided. Alternatively, chips could be assembled front to back if at least one chip has front-to-back contacts. If both chips have backside access, then back to back connections can be made.

Finally, microconnectors can be used to hold gold to gold contacts between chip surfaces as an alternative to thermid adhesive.

Conventionally, silicon memory arrays include redundant word and bit lines, each having its own driver/decoder pair. Fuses are also included so that during testing, when a line is found to fail, a laser is used to blow the fuses and reroute to activate a redundant line as a substitute. However, chips 50 and 56 being face-to-face discourage the use of such fuses. Conventionally, laser fuse blow is performed while chips are still on the wafer. A wafer test is first done, the fuses are laser blown, a final test is performed and the chips are cut from the wafer. However, the laser fuse blow is performed when the full functionality of the chip is on one level, though not yet cut from the wafer. The chips of the present invention must be stacked before full functionality is achieved, thus, each chip shields the other, preventing the conventional use of laser fuse blowing. Fortunately, EEPROMs make excellent fuses that can be programmed or erased using high voltage and low current, where the high voltage may be generated on-chip. Alternatively, an EEPROM device may be used which may be programmed once. In addition, although not preferred, it may be possible to use a laser to blow the fuses prior to joining the chips, however, the testing would not be as comprehensive, since the full functionality of the chip has not yet been achieved. Still another alternative, although not preferred, is that chips provided with a trench for front to back connections can be mounted such that laser fuses in the final assembly are exposed, and laser fuse blow can occur after full functionality testing of the assembled chips.

Figure 16:
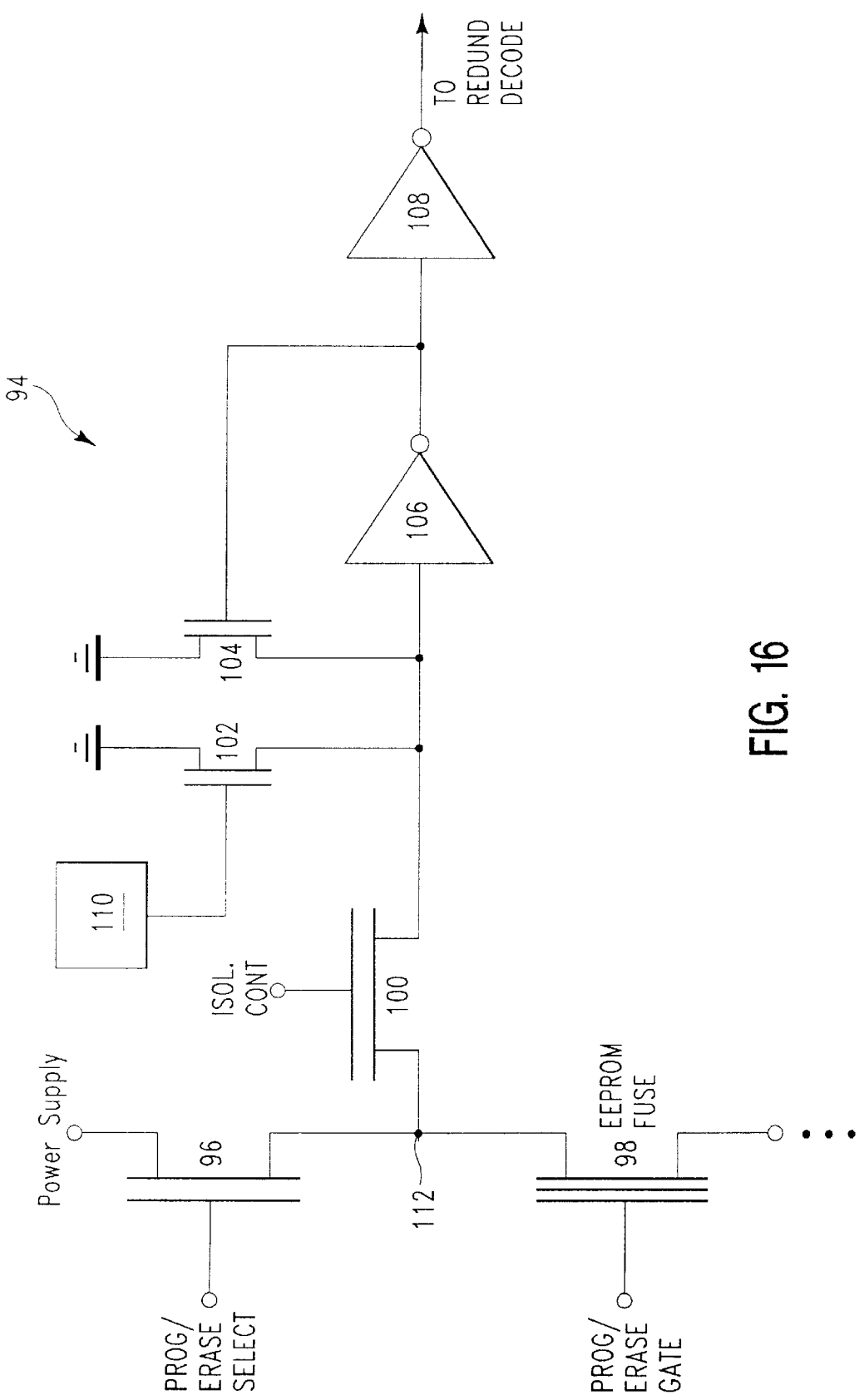
FIG. 16 depicts an exemplary EEPROM fuse circuit useful with the present invention.

FIG. 16 depicts an exemplary EEPROM fuse circuit 94 useful in this respect. Circuit 94 comprises transistors 96, 98, 100, 102 and 104. Circuit 94 also comprises inverters 106 and 108. Transistor 100 isolates the EEPROM fuses (e.g., transistor 98) from the redundancy select circuit 110. The gate of transistor 100 is held at 0 volts. The program/erase gate (floating gate) 111 of transistor 98 is raised to the 10 to 12 volt range. Transistor 96 is held off with a gate voltage of 0 V. The floating gate 111 of transistor 98 collects electrons such that the threshold voltage is raised from 1.0–1.5 volts to more than 5 volts. After programming the EEPROM fuses, the redundancy conditions are set. Redundancy is set when isolation transistor 100 is turned on with 5 V applied to its gate. The program/erase select voltage $V_{PS}$ at the gate of transistor 96 is set at 5 volts. Node 112 will be set at 0 V for an unprogrammed EEPROM and 5 V for a programmed EEPROM. With transistor 102 off, inverters 106 and 108 along with transistor 104 will activate the redundancy decode if the EEPROM fuse is programmed. Further details regarding circuit 94 can be found in "An 85 ns 16 Mb CMOS EPROM With Alterable Word Organization", IEEE, ISSCC Digest of Technology Papers, 1990, pages 56–57.

Figure 17:
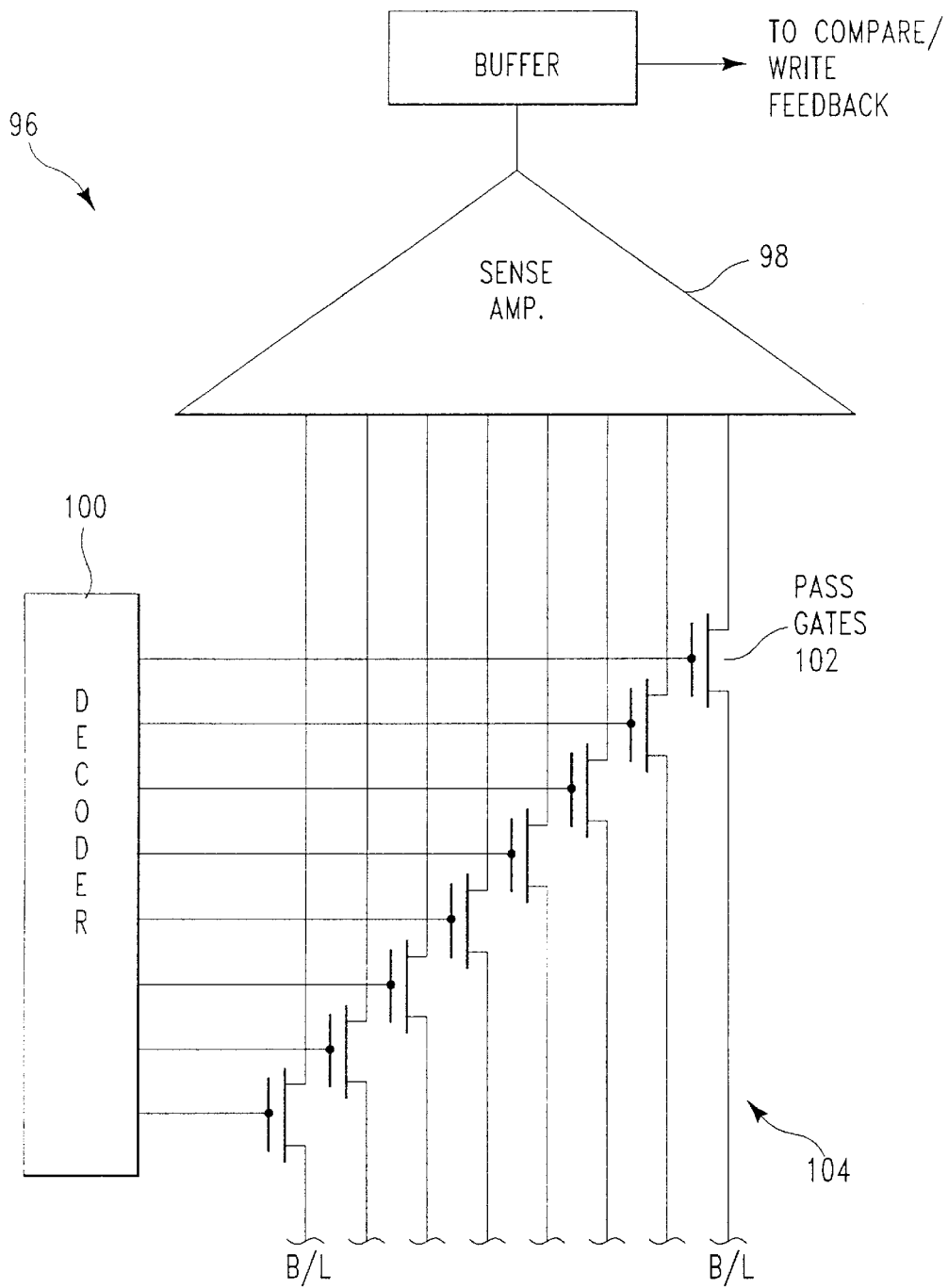
FIG. 17 depicts an exemplary sense amplifier arrangement useful with the EEPROM memory array of FIG. 6.

FIG. 17 depicts a preferred sense amplifier arrangement 96 for use with the EEPROM Array of the present invention. The sense amplifier arrangement 96 would preferably be present on chip 50 of FIG. 6, allowing one out of eight bits to be selected to sense amplifier 98 by decoder 100. Decoder 100 selects one of eight pass gates 102 present on bit lines 104. It will be understood that, although an 8-to-1 sense amp ratio is shown, one could also have, for example, a 16-to-1 or 4-to-1 sense-amp ratio, depending on the performance desired for a particular application.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

We claim:

1. A three-dimensional semiconductor chip having a given overall function comprised of a plurality of subfunctions, comprising:
   a first semiconductor chip comprising circuitry on a first surface thereof for performing a first portion of said plurality of subfunctions;
   a second semiconductor chip vertically adjacent said first semiconductor chip, said second semiconductor chip comprising circuitry on a second surface thereof for performing a second portion of said plurality of subfunctions; and
   a plurality of connectors for connecting said first semiconductor chip and said second semiconductor chip.

2. The three-dimensional semiconductor chip of claim 1 wherein said plurality of connectors comprise a plurality of force-responsive self-interlocking microconnectors disposed on each said semiconductor chip.

3. The three-dimensional semiconductor chip of claim 2 wherein said plurality of force-responsive self-interlocking microconnectors provide both a physical and an electrical connection between said first semiconductor chip and said second semiconductor chip.

4. The three-dimensional semiconductor chip of claim 2, wherein said plurality of force-responsive self-interlocking microconnectors provide a physical connection, and wherein said plurality of connectors also comprise a plurality of reflowable electrical connections.

5. The three-dimensional semiconductor chip of claim 2 wherein said plurality of force-responsive self-interlocking microconnectors are located in at least two channels oppositely disposed on said first semiconductor chip and said second semiconductor chip.

6. The three-dimensional semiconductor chip of claim 5 wherein said at least two channels comprise a raised area.

7. The three-dimensional semiconductor chip of claim 5 wherein said at least two channels comprise an inset.

8. The three-dimensional semiconductor chip of claim 5 wherein said at least two channels comprise a raised area and an inset.

9. The three-dimensional semiconductor chip of claim 2, wherein said plurality of connectors further comprise a plurality of repelling members disposed on one of said first semiconductor chip and said second semiconductor chip, said plurality of repelling members tending to push away a semiconductor chip coming into contact therewith, and said plurality of force-responsive self-interlocking microconnectors tending to pull said first semiconductor chip and said second semiconductor chip together.

10. The three-dimensional semiconductor chip of claim 2, wherein said plurality of force-responsive self-interlocking microconnectors comprise a plurality of sizes providing differing alignment accuracy.

11. The three-dimensional semiconductor chip of claim 2 wherein said plurality of force-responsive self-interlocking microconnectors are located in a continuous channel around an outer portion of each of said first semiconductor chip and said second semiconductor chip.

12. The three-dimensional semiconductor chip of claim 1, wherein said plurality of connectors comprise a plurality of metal bumps oppositely disposed on a facing surface of each said semiconductor chip, said three-dimensional semiconductor chip further comprising a means for connecting corresponding said oppositely disposed plurality of metal bumps, thereby providing both a physical and an electrical connection.

13. The three-dimensional semiconductor chip of claim 1, wherein said given overall function is that of a memory array, wherein said circuitry of said first semiconductor chip comprises a plurality of array lines, wherein said second semiconductor chip comprises a plurality of drivers for said plurality of array lines and wherein said plurality of connectors electrically couple said plurality of array lines and said plurality of drivers.

14. The three-dimensional semiconductor chip of claim 13 wherein said plurality of array lines comprise a plurality of word lines.

15. The three-dimensional semiconductor chip of claim 13 wherein said plurality of drivers comprise a plurality of high voltage drivers.

16. A three-dimensional direct-write EEPROM memory array, comprising:
   a first semiconductor chip comprising a plurality of array lines on a first surface thereof, said plurality of array lines including a plurality of direct-write EEPROM devices;
   a second semiconductor chip vertically adjacent said first semiconductor chip, said second semiconductor chip comprising a plurality of drivers on a second surface thereof corresponding to said plurality of direct-write EEPROM devices; and
   a plurality of connectors for connecting said first semiconductor chip and said second semiconductor chip.

17. The three-dimensional direct-write EEPROM memory array of claim 16 wherein said plurality of drivers comprise a driver capable of generating a voltage of more than 5 volts.

18. The three-dimensional direct-write EEPROM memory array of claim 17 wherein said driver capable of generating more than 5 volts is capable of generating a voltage of at least about 10 volts.

19. The three-dimensional direct-write EEPROM memory array of claim 16, wherein said second semiconductor chip further comprises a plurality of decoders for said plurality of array lines.

20. The three-dimensional direct-write EEPROM memory array of claim 16 wherein said plurality of connectors comprise a plurality of force-responsive self-interlocking microconnectors disposed on each of said first surface and said second surface.

21. The three-dimensional direct-write EEPROM memory array of claim 16, wherein said plurality of electrical connectors comprise a plurality of metal bumps oppositely disposed on each of said first surface and said second surface and wherein an adhesive connects corresponding said oppositely disposed plurality of metal bumps.

22. A method for decreasing semiconductor chip area for a semiconductor chip having a given overall function comprised of a plurality of subfunctions, said method comprising steps of:
   separating circuitry corresponding to said plurality of subfunctions onto at least two vertically adjacent semiconductor chips; and
   connecting said at least two semiconductor chips, thereby forming a three-dimensional semiconductor chip.

23. The method of claim 22 wherein said step of connecting comprises:
   forming a plurality of metal bumps oppositely disposed on joining surfaces of said at least two vertically adjacent semiconductor chips; and
   connecting said oppositely disposed plurality of metal bumps, thereby providing both a physical and an electrical connection.

24. The method of claim 22, wherein said step of connecting comprises forming a plurality of force-responsive self-interlocking microconnectors oppositely disposed on joining surfaces of said at least two vertically adjacent semiconductor chips.

25. The method of claim 24, wherein said step of connecting further comprises forming a plurality of reflowable electrical connections between said at least two vertically adjacent semiconductor chips, said plurality of force-responsive self-interlocking microconnectors providing a physical connection.

26. The method of claim 24, wherein said step of forming comprises creating a channel on which to form said plurality of force-responsive self-interlocking microconnectors.

27. The method of claim 26, wherein said step of creating comprises creating a raised area on which to form said plurality of force-responsive self-interlocking microconnectors.

28. The method of claim 26, wherein said step of creating comprises creating a recessed area in which to form said plurality of force-responsive self-interlocking microconnectors.

29. The method of claim 24, wherein said step of connecting further comprises forming a plurality of micromembers tending to push away a vertically adjacent semiconductor chip, said plurality of force-responsive self-interlocking microconnectors tending to pull said at least two vertically adjacent semiconductor chips together.

30. The method of claim 24, wherein said step of forming comprises forming a plurality of different sized force-responsive self-interlocking microconnectors providing varying degrees of alignment accuracy.

31. The method of claim 22, wherein said given overall function is that of a memory array, said memory array including a plurality of array lines and a plurality of drivers corresponding to said plurality of array lines, wherein said step of separating comprises placing said plurality of array lines on one of said at least two vertically adjacent semiconductor chips and said plurality of drivers on another of said at least two vertically adjacent semiconductor chips, and wherein said step of connecting comprises electrically connecting said plurality of array lines and said plurality of drivers.

32. The method of claim 31, wherein said plurality of array lines comprise a plurality of word lines, wherein said step of separating comprises placing said plurality of word lines on said one of said at least two vertically adjacent semiconductor chips, and wherein said step of electrically connecting comprises electrically connecting said plurality of word lines with said plurality of drivers.

33. The method of claim 32, wherein said memory array comprises a direct-write EEPROM memory array, wherein said plurality of drivers comprise a plurality of high voltage drivers, wherein said step of separating comprises placing said plurality of high voltage drivers on said another of said at least two vertically adjacent semiconductor chips, and wherein said step of electrically connecting comprises electrically connecting said plurality of word lines with said plurality of high voltage drivers.

34. The method of claim 24 wherein said step of forming comprises forming said plurality of force-responsive self-interlocking microconnectors on a joining surface of each of said at least two vertically adjacent semiconductor chips.

35. The three-dimensional semiconductor chip of claim 1, wherein said first surface faces said second surface.

36. The three-dimensional semiconductor chip of claim 1, wherein said plurality of connectors comprises a plurality of reflowable electrical connections.

37. The three-dimensional semiconductor chip of claim 36, wherein said plurality of reflowable electrical connections comprises solder.

38. The three-dimensional semiconductor chip of claim 1, wherein said first semiconductor chip comprises a memory array.

39. The three-dimensional semiconductor chip of claim 1, wherein connection of said first semiconductor chip and said second semiconductor chip is essential to enable said first portion of said plurality of subfunctions and said second portion of said plurality of subfunctions.

40. The three-dimensional semiconductor chip of claim 1, wherein said first semiconductor chip comprises a programmable element for modifying said circuitry on said second semiconductor chip after connecting said first semiconductor chip and said second semiconductor chip.

41. A three-dimensional semiconductor structure having a given overall function comprised of a plurality of subfunctions, comprising:

a first semiconductor chip comprising circuitry on a first surface thereof for performing a first subfunction of said plurality of subfunctions;

a second semiconductor chip vertically adjacent said first semiconductor chip, said second semiconductor chip comprising circuitry on a second surface thereof for performing a second subfunction of said plurality of subfunctions different from said first subfunction, said second surface facing said first surface; and a plurality of connectors for connecting said circuitry on said first semiconductor chip and said circuitry on said second semiconductor chip, wherein connection of said first semiconductor chip and said second semiconductor chip is essential to enable said first subfunction and said second subfunction.

42. The three-dimensional semiconductor chip of claim 41, wherein said plurality of connectors comprise a plurality of force-responsive self-interlocking microconnectors disposed on each said semiconductor chip.

43. The three-dimensional semiconductor chip of claim 42, wherein said plurality of force-responsive self-interlocking microconnectors provide both a physical and an electrical connection between said first semiconductor chip and said second semiconductor chip.

44. The three-dimensional semiconductor chip of claim 42, wherein said plurality of connectors further comprise a plurality of repelling members disposed on one of said first semiconductor chip and said second semiconductor chip, said plurality of repelling members tending to push away a semiconductor chip coming into contact therewith, and said plurality of force-responsive self-interlocking microconnectors tending to pull said first semiconductor chip and said second semiconductor chip together.

45. The three-dimensional semiconductor chip of claim 42, wherein said plurality of force-responsive self-interlocking microconnectors comprise a plurality of sizes providing differing alignment accuracy.

46. The three-dimensional semiconductor chip of claim 41, wherein said plurality of connectors comprises a plurality of reflowable electrical connections.

47. The three-dimensional semiconductor chip of claim 46, wherein said plurality of reflowable electrical connections comprises solder.

48. The three-dimensional semiconductor chip of claim 41, wherein said first semiconductor chip comprises a memory array.

49. The three-dimensional semiconductor chip of claim 41, wherein said first semiconductor chip comprises a programmable element for modifying said circuitry on said second semiconductor chip after connecting said first semiconductor chip and said second semiconductor chip.

* * * * *